United States Patent [19]

Pike

[11] Patent Number: 4,843,634
[45] Date of Patent: Jun. 27, 1989

[54] HIGH POWER SYSTEMS AND METHOD OF TUNING SAME

[75] Inventor: Tudor D. Pike, Essex, United Kingdom

[73] Assignee: The Marconi Company Limited, Stanmore, United Kingdom

[21] Appl. No.: 26,681

[22] Filed: Mar. 17, 1987

[30] Foreign Application Priority Data

Mar. 19, 1986 [GB] United Kingdom ............... 8606786

[51] Int. Cl.$^4$ ...................... H04B 17/034; H03H 7/40
[52] U.S. Cl. .................................. 455/121; 455/125; 333/32; 333/17.3
[58] Field of Search .................. 333/17 M, 17 R, 32; 455/125, 124, 123, 121, 120

[56] References Cited

U.S. PATENT DOCUMENTS

| | | | |
|---|---|---|---|
| 1,595,794 | 10/1926 | Little | 455/125 X |
| 2,505,511 | 4/1950 | Vogel | 333/17 M X |
| 2,609,490 | 7/1952 | Hollywood | 455/123 X |
| 3,165,697 | 1/1965 | Reich et al. | 455/125 X |
| 4,157,515 | 6/1979 | de Bayser et al. | 333/17 R |

OTHER PUBLICATIONS

Nelson-Jones, L.; "F.M. Stereo Tuner"; Wireless World, Apr. 1971, pp. 175–180.
Nelson-Jones, L.; "F.M. Stereo Tuner"; Wireless World, May 1971, pp. 245–249.

*Primary Examiner*—Eugene R. LaRoche
*Assistant Examiner*—Benny Lee
*Attorney, Agent, or Firm*—Spencer & Frank

[57] ABSTRACT

A method of automatically tuning a high power system by measuring the gradient of component value against efficiency for each component impedance in turn and, for each component, finding two points of equal and opposite efficiency-to-impedance gradient and setting the impedance of the component to a value half-way between these points.

18 Claims, 2 Drawing Sheets

HIGH POWER SYSTEMS AND METHOD OF TUNING SAME

FIELD OF THE INVENTION

This invention relates to a method for automatically setting up a high power variable frequency electrical system.

DESCRIPTION OF THE PRIOR ART

For a high power system even relatively minor power losses can represent significant amounts of power in absolute terms. For maximum efficiency in a high power system the impedance of one stage should be properly matched to that of a following stage. This cannot be arranged simply by choice of component impedance values because the impedance of certain components in a variable frequency system will be highly frequency sensitive, so the system must be re-tuned every time the operating frequency is changed. Altering the values of the impedance of some components in the system to pre-set values for each different frequency is also unsatisfactory in practice, because changes in the impedance of reactive components may occur over a period of time due, for example, to ageing or temperature variations, and the impedance of a highly frequency sensitive component such as an antenna, may change with the weather.

It has been proposed to automatically adjust a system by measuring the relative phases of source and load signals, but such an adjustment is complex and it is not always possible to adjust for maximum efficiency using this approach.

BRIEF SUMMARY OF THE INVENTION

According to a first aspect of this invention a method of setting up a high power system includes the steps of: monitoring a signal level at a particular point in the system; adjusting the value of the reactance of a component in such a sense as to vary the monitored signal level through a point resulting in a maximum or minimum value of the monitored signal level until the monitored signal level reaches a reference value having a predetermined property; readjusting the value of the reactance of the component in the reverse sense to vary the monitored signal level back through said maximum or minimum value until the same reference value is obtained; resetting the value of the reactance of the component to a value mid-way between those two values of reactance which produced the two reference values of the monitored signal level; and iteratively repeating said steps for a plurality of components in said system.

According to a second aspect of this invention a method of setting up a high power system includes the steps of: monitoring a signal level at a particular point in the system; making an initial adjustment to the value of the reactance of a reactive component to determine whether the monitored signal level changes in a required sense (i.e., direction). in response to the initial adjustment; adjusting the value of the reactance of the component in the required sense so as to vary the monitored signal level through a point of maximum or minimum value of the monitored signal level until it reaches a reference value having a predetermined property; re-adjusting the value of the impedance of the component in the reverse sense to vary the monitored signal level back through said maximum or minimum value until the same reference value is obtained; resetting the reactance of the component to a value mid-way between those two values which produced said reference value; and repeating said steps for a plurality of reactance components in said system.

The maximum or minimum value in the monitored signal level which results from the adjustment of the reactance of a particular component is arranged to represent the maximum efficiency at which that stage of the system can operate with respect to the operating states of other stages in the system. In a high frequency high power electrical system, it may be that the highest possible efficiency for a particular stage cannot be achieved until preceding or following stages have themselves been brought to a more efficient state of adjustment. Thus a number of reactive components may be adjusted in turn to progressively raise the efficiency of the system as a whole. Then in a subsequent iteration some or all of the reactive components are adjusted again to produce a new and higher state of efficiency which is higher than that which could have been achieved on the first round of adjustments.

In a practical system, the adjustment of the reactance of a reactive component alters the impedance of the circuit of which it forms a part at the operating frequency thereof. It is found that for relatively small tuning errors in a system component, the variation in the monitored signal level which occurs during the adjustment of the reactance of a given component as the monitored signal level is varied through a maximum or a minimum value is indicative of the peak efficiency of the component, since the maximum and minimum values are substantially symmetrical about the tune point of the component. As a consequence, the selection of the mid-point between two reference values on opposite sides of the maximum or minimum point gives a component impedance value which is remarkably close to that needed for peak efficiency. As this method does not require a detailed knowledge of the internal operation of the various stages of a system, it is much more versatile than a method which relies on setting up optimum signal phase conditions. For this reason the method can be applied to many different points in a large system, and the method can be performed under the control of a common controller circuit.

The invention is particularly applicable to the setting up of a high power radio transmitter which is required to operate over a wide frequency band.

BRIEF DESCRIPTION OF THE DRAWINGS

The invention is further described by way of example, with reference to the accompanying drawings, in which:

FIG. 1 shows the output stage of the high power radio transmitter,

FIGS. 2a–2d are explanatory diagrams, and

FIG. 3 shows part of a control circuit for setting up the transmitter.

DETAILED DESCRIPTION

FIG. 1 shows the output stage of a high power radio transmitter where the output of a previous low power stage is applied at terminal 1 and is amplified by an input amplifier 2. The amplified signal goes through the variable inductor 3 which, with capacitor 4, matches the output impedance of amplifier 2 with the input impedance of a tetrode power tube 5. Tetrode power tubes 5 and 6 are supplied with current by current sources 7 and 8 respectively. The tetrode power tubes 5 and 6 are linked by a tuned circuit formed by variable capacitors 9 and 10 and inductor 11. This tuned circuit is used to impedance match the tetrode power tubes 5 and 6.

The tetrode power tube 6 is linked to a remote antenna 12 by a matched transmission line made up of a plurality of inductances 13 and variable capacitances 14.

If efficiency of a transmission is defined as the ratio of output power to input power, it is possible to measure the efficiency of a radio transmitter directly by comparing the cathode current in the tetrodes with the forward RF voltage into the load. If a curve of component value (the component value being, for example, inductance if the component is a variable inductor, such as inductor 3 in FIG. 1, or capacitance if the component is a variable capacitor such as capacitors 9, 10, and 14 in FIG. 1) is plotted against transmitter efficiency for a reactive component in the transmitter, a curve that is highly symmetrical about its maximum, for component values close to the maximum, is obtained.

In order to tune the transmitter to maximum efficiency, the values of the variable components 3, 9, 10 and 14 will need to be adjusted. The way in which this is done will be described with reference to FIGS. 2a-2d.

FIGS. 2a and 2d show the variation of efficiency which occurs whilst a component is being adjusted to its optimum value.

Referring to FIG. 2a, an arbitrary initial component value 15 is shown. The gradient of the component's reactance value as it varies with respect to efficiency, is measured by altering the component's reactance value slightly. From this gradient, the direction of the peak of the efficiency curve is deduced. The reactance value of the component is then adjusted towards and through the peak 16 of the efficiency curve, as seen in FIG. 2b, until the gradient of the component's reactance value as it varies with respect to efficiency reaches some predetermined reference value at a point 17. The adjustment stops at this point 17 and the component value 18 is noted. Instead of using gradient as a reference value, a predetermined value of the monitored signal level could be used instead. This adjustment is carried out by means of a stepping motor connected to the component which is used to vary the reactance of the component. A stepping motor is used because its position can be easily calculated by counting the number of steps it has taken.

The value of the reactance of the component is then adjusted back in the opposite direction, and it travels through the peak 16 of the efficiency curve, see FIG. 2c, until the gradient is equal to but opposite in sense to the reference value used to decide on point 17; this is point 19. The component's reactance value 20 at this point is noted. The mid-point of the reactance values 18 and 20 is then interpolated by resetting the stepping motor by exactly half the total number of steps moved between points 17 and 19. Thus the reactance component is adjusted to a new point 21 midway between the points 20 and 18, thereby putting the reactance of the component at the optimum point 16 of the efficiency curve. As the value of each reactive component is frequency dependent, the point 16 generally represents the tune point of a circuit section of which the component forms a part.

Referring to FIG. 3 there is shown therein the computer control system, in block diagram form so as to indicate the functions performed by its constituent parts.

When the transmitter is set to a new frequency, most of the reactances of the variable components will need to be re-set for optimum efficiency. When such a change is made, all variable components are simultaneously respectively set to appropriate approximate reactance values thereof by the component value adjuster 24. This operation is carried out using information retrieved from an initial value store 25.

When these initial approximate values have been set, one variable component (e.g. inductor 3) is selected by the controller 26. The controller 26 instructs the component selector 22 and monitor point selector 27 which of the plurality of stepping motor control lines 23 and which of the plurality of monitoring lines 28 to use. Each monitoring line 28 is connected to a different one of the monitor points 33, 34, 35, 36 and 37 which are shown in FIG. 1. The controller 26 also selects from data store 29 the information which is needed by the evaluator 30.

The evaluator 30 then adjusts the reactance of the selected component to its optimum value using information obtained via the monitor point selector 27 and data from data store 29 by altering the selected components reactance values by means of component value adjuster 24 in accordance with the process described with reference in FIG. 2.

When adjustment of the reactance of the selected component 3 is finished, the controller 26 selects the next component 9 and monitor point 34 in sequence and repeats the foregoing optimization process until all components have been adjusted for maximum efficiency. The entire sequence can then be iteratively repeated to further optimize the setting of each component, as each monitored value could well be influenced by the adjustment of more than a single component.

I claim:

1. A method of tuning a high power system, including the steps of:
   (a) selecting a component in the system having an adjustable reactance, and selecting a point in the system for monitoring a signal level;
   (b) monitoring said signal level at the selected point in the system;
   (c) adjusting the value of the reactance of said component in a first direction to vary the monitored signal level from an initial level through a point of one of a maximum and a minimum signal level;
   (d) continuing to adjust the value of the reactance of said component in said first direction until a first reactance value is reached at which said monitored signal level has a first reference level having a predetermined property;
   (e) re-adjusting the value of the reactance of said component in a reverse direction to vary said monitored signal level back through said one of a maximum and a minimum signal level until a second reactance value is reached at which said monitored signal level equals said first first level;
   (f) resetting the reactance of said component to a value which is mid-way between said first and said second reactance values;
   (g) selecting another one of a plurality of components in the system having an adjustable reactance, and selecting another point in the system for monitoring the signal level; and
   (h) repeating steps (b)-(g) for a plurality of components in said system.

2. A high power system as claimed in claim 1, further comprising the step of controlling each said reactance by a common control circuit.

3. A method of tuning a high power system, comprising the steps of:
   (a) selecting a component in the system having an adjustable reactance, and selecting a point in the system for monitoring a signal level;
   (b) monitoring said signal level at the selected point in the system;
   (c) changing the value of the reactance of the component in one direction and simultaneously monitoring said signal level to determine a direction of change in magnitude f the monitored signal level;
   (d) based upon the result of the determination made in step (c), determining a required direction of change in magnitude of said value of said reactance of said component;
   (e) adjusting the magnitude of said value of said reactance of said component in said required direction of change from an initial value to vary said monitored signal level from an initial level through a point of one of a maximum and a minimum level;
   (f) continuing to adjust the value of said reactance of said component in said required direction until a first reactance value of said component is reached at which said monitored signal level has a first reference level having a predetermined property;
   (g) re-adjusting the value of the reactance of the component in a reverse direction to vary said monitored signal level back through said one of said maximum and minimum level until a second reactance value of said component is reached at which said monitored signal level equals said first reference level;
   (h) resetting the reactance of said component to a value which is mid-way between said first and second reactance values;
   (i) selecting another one of a plurality of components in the system having an adjustable reactance, and selecting another respective point in the system for monitoring the signal level;
   (j) repeating steps (b)–(i) for a plurality of reactive components in said system.

4. A method of setting up a high power system as claimed in claim 2 and wherein the value of the reactance of the component being adjusted is changed in discrete steps.

5. A method of setting up a high power system as claimed in claim 4 and wherein in step (i) the action of resetting the reactance of the component to a value mid-way between said first and second reactance values is carried out by altering the value of the reactance by half the number of discrete steps made between said first and second reactance values.

6. A method of setting up a high power system as claimed in claim 2 and wherein in step (a), further comprising selecting ones of said plurality of the components to be adjusted and respective ones of the points for monitoring the signal level in a predetermined series.

7. A method of setting up a high power system as claimed in claim 6 and wherein steps (a)–(i) are repeated according to said predetermined series to iteratively optimize the adjustment of each component.

8. A method of setting up a high power system as claimed in claim 2 and wherein said predetermined property is the gradient of component value measured with respect to the efficiency of the high power system.

9. A method of tuning a high power system as claimed in claim 8 and wherein in steps (f) - (h) the value of the reactance of said component which is being adjusted is changed in discrete steps.

10. A method of tuning a high power system as claimed in claim 9 and wherein in step (i) said action of resetting said component to said value mid-way between said first and second reactance values is carried out by altering said component value by half the number of discrete steps performed in changing the magnitude of said value of said reactance of said component between said first and second reactance values.

11. A method of tuning a high power system as claimed in claim 8 and wherein in steps (a) and (g), providing a predetermined sequence in which each one of the plurality of components are selected and providing a predetermined sequence in which respective points in the system are selected for monitoring the signal level.

12. A method of tuning a high power system as claimed in claim 11 and wherein said predetermined sequence is repeated to progressively optimize the adjustment of each component.

13. An apparatus for tuning a high power system, comprising:
   (a) a component selecting means for selecting one of a plurality of components in the system, each of the components having an adjustable reactance;
   (b) a location selecting means for selecting a point in the system for monitoring a signal level, said location selecting means including a signal level monitoring means for monitoring the signal level at said selected point in the system;
   (c) a reactance changing means for changing the value of the reactance of the component in one direction;
   (d) an evaluating means for evaluating a direction of change in magnitude of the monitored signal caused by a change in the value of said reactance of said component and for determining a required direction of change of the value of said reactance of said component;
   (e) a control means for iteratively controlling said component selecting means, said location selecting means, said evaluating means, and said reactance changing means to separately adjust a plurality of components in the system,
   said control means causing said component selecting means to select one of the plurality of components in the system;
   said control means causing said evaluating means to determine a required direction of change of said reactance of said component; said control means causing said reactance changing means to adjust the magnitude of the value of said reactance of the selected component in said required direction of change from an initial value to vary the monitored signal level from an initial level through one of a maximum and a minimum level until a first reactance value of said component is reached at which said monitored signal level has a first reference level having a predetermined property;
   said control means causing said reactance changing means to re-adjust the value of the reactance of said component in a reverse direction to vary the monitored signal level back through said one of said maximum and minimum level until a second reactance value is reached at which said monitored signal level equals said first reference;

said control means causing said reactance adjusting means to reset the reactance of the component to a value which is mid-way between said first and second values; whereby the reactance of a plurality of components in the system can be separately adjusted to tune the system.

14. A higher power system as claimed in claim 13 and wherein each one of said plurality of components comprises a tuned stage associated with a wideband antenna.

15. A high power system as claimed in claim 14 and wherein said wideband antenna is linked to said plurality of tuned stages by a transmission line and said plurality of tuned stages are also linked to a tetrode valve.

16. A high power system as claimed in claim 13 and wherein the adjusted components include a plurality of tuned stages associated with a wideband antenna.

17. An apparatus for tuning a high power system as claimed in claim 13, wherein said predetermined property is the gradient of the magnitude of the value of the reactance of the component with respect to a value representing efficiency of the system.

18. A high power system as claimed in claim 17 and wherein the adjusted components include a plurality of tuned stages associated with a wideband antenna.

* * * * *